(12) United States Patent
Nakamura

(10) Patent No.: US 11,362,509 B2
(45) Date of Patent: Jun. 14, 2022

(54) METHOD OF POWER SUPPLY LINE PROTECTION, MASTER DEVICE, AND POWER SUPPLY SYSTEM

(71) Applicant: Yazaki Corporation, Tokyo (JP)

(72) Inventor: Yoshihide Nakamura, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/864,291

(22) Filed: May 1, 2020

(65) Prior Publication Data

US 2020/0389012 A1 Dec. 10, 2020

(30) Foreign Application Priority Data

Jun. 6, 2019 (JP) .............................. JP2019-105856

(51) Int. Cl.
| | | |
|---|---|---|
| *H02H 5/04* | (2006.01) | |
| *G01R 31/50* | (2020.01) | |
| *H02H 3/087* | (2006.01) | |
| *H02H 7/22* | (2006.01) | |

(52) U.S. Cl.
CPC ............ *H02H 5/041* (2013.01); *G01R 31/50* (2020.01); *H02H 3/087* (2013.01); *H02H 5/047* (2013.01); *H02H 7/226* (2013.01)

(58) Field of Classification Search
CPC ........ H02H 5/041; H02H 7/226; H02H 7/228; H02H 6/00; H02H 6/005; H02H 5/04; H02H 5/047; H02H 5/048
See application file for complete search history.

(56) References Cited

U.S. PATENT DOCUMENTS

| | | | |
|---|---|---|---|
| 2011/0080681 A1 | 4/2011 | Maruyama et al. | |
| 2012/0081825 A1* | 4/2012 | Nakamura | ............. H02H 7/228 361/93.8 |
| 2013/0253722 A1* | 9/2013 | Nakamura | .......... B60R 16/0232 700/295 |
| 2016/0315464 A1* | 10/2016 | Furuto | ..................... H02H 5/04 |

FOREIGN PATENT DOCUMENTS

| | | |
|---|---|---|
| JP | 2013-085469 A | 5/2013 |
| JP | 2018-093624 A | 6/2018 |
| JP | 2019-41198 A | 3/2019 |
| WO | 2012077304 A2 | 6/2012 |
| WO | 2018/101012 A1 | 6/2018 |

* cited by examiner

*Primary Examiner* — Jared Fureman
*Assistant Examiner* — Christopher J Clark
(74) *Attorney, Agent, or Firm* — Sughrue Mion, PLLC

(57) ABSTRACT

A power supply system includes: a battery; a master device supplied with power from the battery; and a slave device supplied with power from the master device via a first power supply line. The slave device supplies power to a load via a second power supply line. The master device estimates a temperature of the second power supply line. When the estimated temperature of the second power supply line is higher than a second cutoff threshold, power supply via the second power supply line is cut off.

4 Claims, 6 Drawing Sheets

METHOD OF POWER SUPPLY LINE PROTECTION, MASTER DEVICE, AND POWER SUPPLY SYSTEM

TECHNICAL FIELD

The present invention relates to a method of power supply line protection.

BACKGROUND ART

A fuse is used to protect electrical circuits from overcurrent. The fuse melts when the temperature exceeds a predetermined temperature due to Joule heat generated by the flow of current, and cuts off the circuit. In addition, instead of using a fuse, there is also a technology simulating the characteristics of the fuse that protects the electric circuit from overcurrent by turning off the power and shutting off the circuit when the estimated temperature becomes larger than a predetermined value, with means for estimating the temperature of the power supply line and with a switch (Patent Literature 1 and 2).

PRIOR ART DOCUMENT

Patent Literature

Patent Literature 1: JP 2013-85469 A
Patent Literature 2: JP 2018-93624 A

SUMMARY OF INVENTION

Technical Problem

In recent years, automobiles have been digitized, and the number of electrical components mounted on the automobile has been increasing. In order to suppress an increase in wiring and an increase in cost, a master-slave system has been used. In the master-slave system, by providing a master device that collectively controls multiple slave devices separately from the slave device that controls individual electrical components, the functions of the slave devices are reduced and the cost is suppressed.

In the master-slave system, a load is supplied with power from the slave device. Therefore, in order to protect the load and the slave device from an overcurrent, a function of interrupting a power supply line between the load and the slave device when an overcurrent occurs is required. However, the technologies disclosed in Patent Literatures 1 and 2 are not technologies in consideration of the master-slave system. Therefore, when the techniques disclosed in Patent Literatures 1 and 2 are simply applied to the master-slave system, the slave device not only has a function of cutting off a power supply line to a load, but also has a function of estimating the temperature of the power supply line. Therefore, the functions of the slave device increase and the cost increases.

The present invention has been made in view of the above background, and has as its object to protect a power supply line in a master-slave system without increasing the functions of a slave device.

Solution to Problem

According to a first aspect of the present invention, there is provided a method of power supply line protection in a power supply system, the power supply system including: a battery; a master device supplied with power from the battery; and a slave device supplied with power from the master device via a first power supply line, and the slave device supplying power to a load via a second power supply line,
the method including the steps of:
estimating a temperature of the second power supply line by the master device; and
cutting off power supply via the second power supply line when the estimated temperature of the second power supply line is higher than a second cutoff threshold. The method of power supply line protection may further include:
estimating a temperature of the first power supply line by the master device; and
cutting off power supply via the first power supply line when the estimated temperature of the first power supply line is higher than a first cutoff threshold.

According to a second aspect of the present invention, there is provided a master device in a power supply system, the power supply system including: a battery; the master device supplied with power from the battery; and a slave device supplied with power from the master device via a first power supply line, and the slave device supplying power to a load via a second power supply line,
the master device including:
a control unit that estimates a temperature of the second power supply line,
wherein the control unit estimates the temperature of the second power supply line based on a current value of the second power supply line acquired from the slave device, and turns off a switch for switching supply/cutoff of power via the second power supply line to cut off the power supply via the second power supply line when the estimated temperature of the second power supply line is greater than a second cutoff threshold.

According to a third aspect of the present invention, there is provided a power supply system including:
a battery;
a master device supplied with power from the battery; and
a slave device supplied with power from the master device via a first power supply line, the slave device supplying power to a load via a second power supply line,
the power supply system further including:
a switch for switching supply/cutoff of power via the second power supply line,
the master device including:
a control unit that estimates a temperature of the second power supply line,
wherein the control unit estimates the temperature of the second power supply line, and turns off the switch to cut off the power supply via the second power supply line when the estimated temperature of the second power supply line is greater than a second cutoff threshold.

Effect of the Invention

According to the aspects described above, in the master-slave system, the power supply line can be protected without increasing the functions of the slave device.

BRIEF DESCRIPTION OF DRAWINGS

FIG. 1 is a diagram showing a communication/power supply system 100 according to an embodiment of the present invention;

DESCRIPTION OF EMBODIMENTS

<Power Supply System 100>

Figure 1:
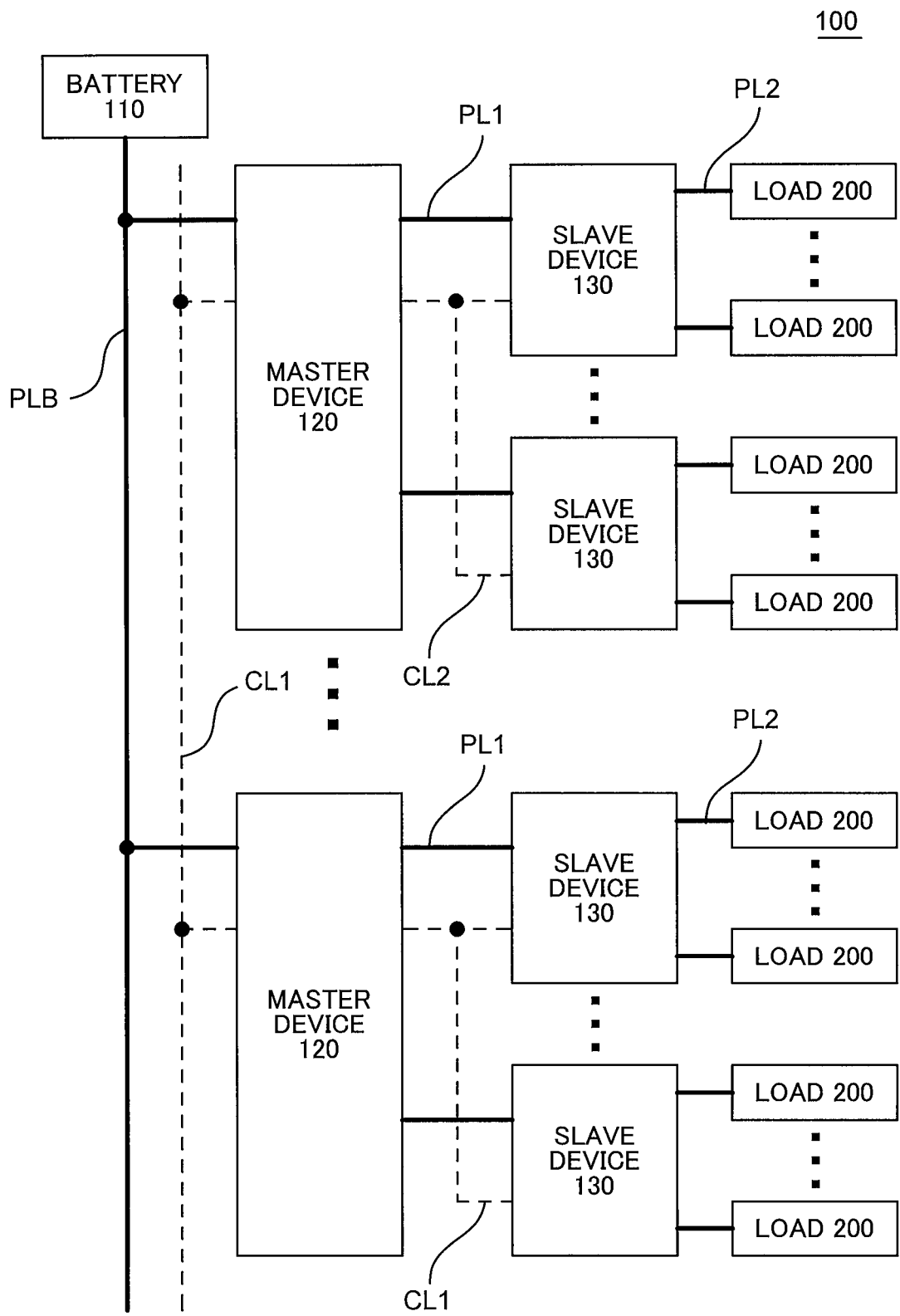
FIG. 1 is

FIG. 1 is a diagram showing a communication/power supply system 100 according to an embodiment of the present invention. The power supply system 100 includes a battery 110, a plurality of master devices 120, and a plurality of slave devices 130.

The master device 120 receives power supply from battery 110 via battery power supply line PLB. The plurality of slave devices 130 are connected to one master device 120 via a first power supply line PL1. The master device 120 and the plurality of slave devices 130 connected by the first power supply line PL1 form one sub-network.

One first power supply line PL1 corresponds to each of the plurality of slave devices 130. The slave device 130 receives power from the master device 120 via the corresponding first power supply line PL1. In addition, the slave device 130 is connected to at least one load 200 via the second power supply line PL2. One second power supply line PL2 corresponds to each of the at least one load 200, and the load 200 receives power from the slave device 200 via the corresponding second power supply line PL2.

Further, the plurality of master devices 120 are connected to the first communication line CL1, and communicate with each other via the first communication line CL1. The first communication line CL1 is a communication line for a protocol such as CAN (Controller Area Network), MOST (Media Oriented System Transport), or FlexRay. Also, the master device 120 is connected to the plurality of slave devices 130 in the own sub-network via the second communication line CL2. The master device 120 controls the communication of the slave devices 130 in the sub-network via this second communication line CL2. The slave device 130 controls the load 200 connected by the second power supply line PL2 based on this communication. The second communication line CL2 is, for example, a communication line for a protocol such as LIN (Local Interconnect Network). The slave device 130 functions as a slave node in the LIN, and the master device 120 functions as a master node in the LIN. Note that the slave device 130 may also be connected to the first communication line CL1 connected to the master device 120, and the master device 120 may control the slave device 130 via the first communication line CL1.

Figure 2:
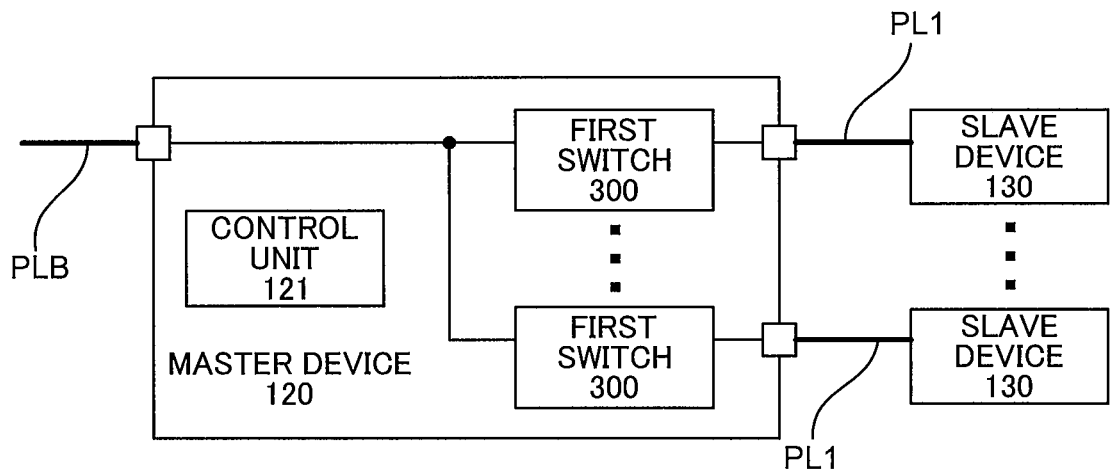
FIG. 2 is a diagram illustrating a master device 120 according to an embodiment of the present invention.

FIG. 2 is a diagram illustrating a master device 120 according to an embodiment of the present invention. The master device 120 includes a plurality of first switches 300, and a control unit 121 that controls on/off of the first switches 300. Each of the plurality of first switches 300 corresponds to one of the first power supply lines PL1, is arranged upstream of the corresponding first power supply line PL1, and for example, as shown in FIG. 2, is connected via the power supply line to a terminal which is connected to the corresponding first power supply line PL1.

Therefore, when the first switch 300 is on, power is supplied to the corresponding first power supply line PL1, and power is supplied to the slave device 130 connected to the corresponding first power supply line PL1. When the first switch 300 is off, the supply of power to the corresponding first power supply line PL1 is cut off, and the supply of power to the slave device 130 connected to the corresponding first power supply line PL1 is cut off.

Figure 3:
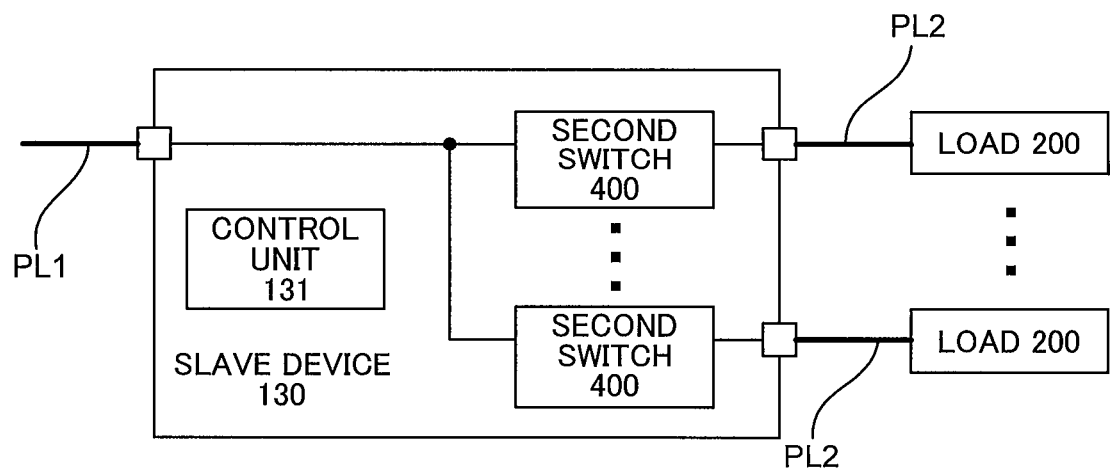
FIG. 3 is a diagram illustrating the slave device 130 according to an embodiment of the present invention.

FIG. 3 is a diagram illustrating the slave device 130 according to an embodiment of the present invention. The slave device 130 has at least one second switch 400 and a control unit 131 that controls on/off of the second switch 400. Each of the at least one second switch 400 corresponds to one of the second power supply lines PL2, is arranged upstream of the corresponding second power supply line PL2, and for example, as shown in FIG. 3, is connected via the power sully line to a terminal which is connected to the corresponding second power supply line PL2.

Therefore, when the second switch 400 is on, power is supplied to the corresponding second power supply line PL2, and power is supplied to the load 200 connected to the corresponding second power supply line PL2. When the second switch 400 is off, the supply of power to the corresponding second power supply line PL2 is cut off, and the supply of power to the load 200 connected to the corresponding second power supply line PL2 is cut off.

Thus, for example, the master device 120 controls on/off of the first switch 300, thereby controls on/off of the power of the slave device 130, and the slave device 130 controls on/off of the second switch 400, thereby controls on/off of the power of the load 200.

For example, when there is a load 200 to be turned on, the master device 120 or the slave device 130 outputs a load control signal indicating that the load 200 is to be turned on to the slave device 130 that controls the load 200. The load control signal includes the ID of the slave device 130 that controls the load 200 to be turned on, and the master device 120 determines from the ID whether the load control signal is for the slave device 130 included in its own sub-network. Then, if the slave device 130 is included in its own sub-network, the first switch 300 corresponding to the first power supply line PL1 that supplies power to this slave device 130 is turned on, and the power is supplied to this slave device 130, and this slave device 130 is turned on. The turned-on slave device 130 receives the load control signal from the master device 120 via the second communication line CL2, and based on this load control signal, the second switch 400 corresponding to the second power supply line PL2 that supplies power to the load 200 to be turned on is turned on. Thus, the power is supplied to the load 200, and the load 200 is turned on.

When an overcurrent occurs due to a short circuit or the like in the circuit, the master device 120, the slave device 130, the load 200, the power supply lines PL1, PL2, and the like may be damaged. For this reason, it is necessary to provide a cutoff means such as a fuse on the power supply lines PL1 and PL2 so that the power supply lines PL1 and PL2 can be cut off when an overcurrent occurs. Therefore, the power supply system 100 of the present embodiment has a function of estimating the temperature of the power supply line, turning off the switch when the estimated temperature exceeds a predetermined value, and cutting off the power supply line.

Specifically, the control unit 121 of the master device 120 of the present embodiment estimates the temperature of the first power supply line PL1 and the temperature of the second power supply line PL2. The control unit 121 estimates the temperature of the first power supply line PL1 and the temperature of the second power supply line PL2 using, for example, a method described in Patent Literature 1. In order to obtain a current value used for estimating the temperature of the first power supply line PL1 and the temperature of the second power supply line PL2, for example, each of the first current supply line PL1 and the second power supply line PL2 may be provided with an ammeter.

In addition, the first switch 300 and the second switch 400 may have a function of measuring a current value flowing through the power supply line in addition to a switch function such as an IPD (Intelligent Power Device), a shunt resistor+MOSFET, and a sense MOSFET with a current detection function. This makes it possible to obtain the value of the current used for estimating the temperature of the power supply line without providing a separate ammeter.

Then, control unit 121 compares the estimated temperature of first power supply line PL1 with the first cutoff threshold, and when the estimated temperature of first power supply line PL1 is higher than the first cutoff threshold, the power supply via the first power supply line is cut off. Specifically, for example, when the estimated temperature of the first power supply line PL1 is higher than the first cutoff threshold, the control unit 121 turns off the first switch 300 corresponding to the first power supply line PL1, and the power supply via the first power supply line PL1 is cut off. That is, in the present embodiment, the same effect as when the fuse that is cut when the temperature reaches the temperature corresponding to the first cutoff threshold is provided in the first power supply line PL1 can be obtained.

Therefore, in the present embodiment, it is possible to prevent the first power supply line PL1 from becoming high temperature, and to protect the first power supply line PL1. Further, the first cutoff threshold may be determined based on the smoke temperature of the first power supply line PL1, for example, as in Patent Literature 1. In this way, it is possible to prevent the first power supply line PL1 from being heated until it emits smoke. Further, unlike the case of using a fuse, the first cutoff threshold (that is, the amount of current at the time of cutoff) can be set according to the characteristics of the load 200. It is possible to use an electric wire having a smaller diameter than before as the first power supply line PL1. As a result, the weight of the entire vehicle can be reduced.

Further, control unit 121 compares the estimated temperature of second power supply line PL2 with the second cutoff threshold, and when the estimated temperature of second power supply line PL2 is higher than the second cutoff threshold, the power supply via the second power supply line is cut off. Specifically, for example, when the estimated temperature of the second power supply line PL2 is higher than the second cutoff threshold, the control unit 121 outputs a request to turn off the second switch 400 corresponding to this second power supply line PL2 to the slave device 130 that controls the second switch 400. Then, the slave device 130 that has received this request turns off the second switch 400 and cuts off the power supply via the second power supply line PL2. That is, in the present embodiment, the same effect as when the fuse that is cut when the temperature reaches the temperature corresponding to the second cutoff threshold is provided in the second power supply line PL2 can be obtained.

Therefore, in the present embodiment, it is possible to prevent the second power supply line PL2 from becoming high temperature, and to protect the second power supply line PL2. Further, in the present embodiment, since the control unit 121 of the master device 120 estimates the temperature of the second power supply line PL2, it is not necessary to add a new function to the slave device 130 to protect the power supply line. Therefore, in the present embodiment, it is possible to protect the power supply line without increasing the functions of the slave device 130. As a result, in the present embodiment, the size of the slave device 130 can be reduced. Further, the second cutoff threshold may be determined based on the smoke temperature of the second power supply line PL2, for example, as in Patent Literature 1. In this way, it is possible to prevent the second power supply line PL2 from being heated until it emits smoke. Further, unlike the case of using a fuse, the second cutoff threshold (that is, the amount of current at the time of cutoff) can be set according to the characteristics of the load 200. It is possible to use an electric wire having a smaller diameter than before as the second power supply line PL2. As a result, the weight of the entire vehicle can be reduced.

After the power supply is cut off, the first power supply line PL1 and the second power supply line PL2 cool down by radiating heat. Therefore, the control unit 121 may repeatedly perform the above-described estimation of the temperature and determination of the cutoff/cancellation of the cutoff of the power supply at predetermined time intervals for each of the first power supply lines PL1 and each of the second power supply lines PL2. Then, for each of the first power supply lines PL1 and each of the second power supply lines PL2 when it is determined to cut off the power supply, the cutoff determination state may be stored. Then, when the temperature of the power supply line in the cutoff determination state becomes smaller than a predetermined value, the cutoff determination is canceled, and the fact not the cutoff determination state of this power supply line may be stored.

For example, the control unit 121 may cancel the cutoff determination and store that the first power supply line PL1 is not in the cutoff determination state in a case that the estimated temperature of the first power supply line PL1 becomes lower than the first cutoff cancellation temperature after the cutoff determination to cut off the power supply to the first power supply line PL1 is made. At this time, if there is a request from another master device 120 or slave device 130 to turn on the first switch 300 corresponding to the first power supply line PL1, the control unit 121 may turn on the first switch 300 and restart power supply to the first power supply line PL1. The first cutoff cancellation temperature may be set to a value smaller than the first cutoff temperature.

Further, the control unit 121 may cancel the cutoff determination and store that the second power supply line PL2 is not in the cutoff determination state in a case that the estimated temperature of the second power supply line PL2 becomes lower than the second cutoff cancellation temperature after the cutoff determination to cut off the power supply to the second power supply line PL2 is made. At this time, if there is a request from another master device 120 or slave device 130 to turn on the second switch 400 corresponding to the second power supply line PL2, the control unit 121 may turn on the second switch 400 and restart power supply to the second power supply line PL2. The second cutoff cancellation temperature may be set to a value smaller than the second cutoff temperature.

In this way, when the power supply line cools down, it becomes possible to restart the supply of power via this power supply line.

In the above-described embodiment, the first switch 300 is included in the master device 120, but the first switch 300 may be arranged anywhere as long as the power supply via the corresponding first power supply line PL1 can be cut off. For example, the first switch 300 may be arranged in the middle of the first power supply line PL1 outside the master device 120. In addition, the second switch 400 may be arranged anywhere as long as the power supply via the corresponding second power supply line PL2 can be cut off. For example, the second switch 400 may be arranged in the middle of the second power supply line PL2 outside the slave device 130.

Further, in the above embodiment, the control unit 121 of the master device 120 estimates the temperature of the first power supply line PL1. However, the control unit 121 may estimate the temperature of the power supply line extending from the first switch 300 to the terminal to which the first power supply line PL1 is connected, and protect the power supply line in the manner described above. Further, the control unit 121 of the master device 120 may estimate the temperature of the power supply line extending from the second switch 400 to the terminal to which the second power supply line PL2 is connected, and protect the power supply line in the manner described above.

<Method of Power Supply Line Protection>

Figure 4:
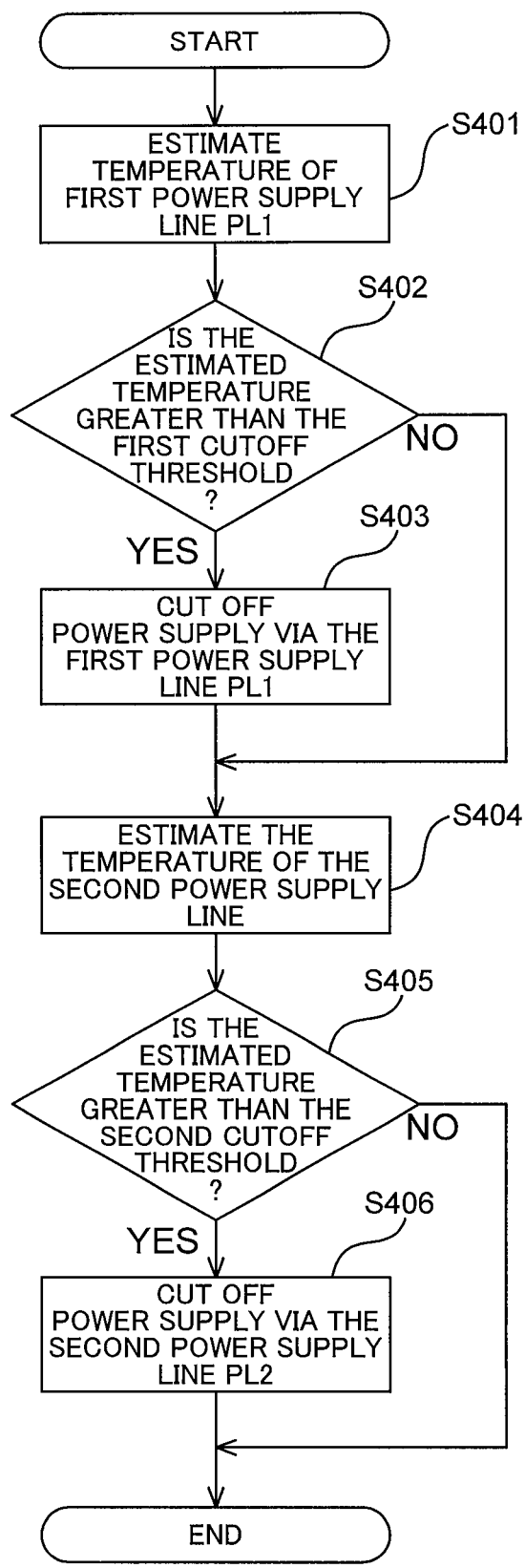
FIG. 4 is a flowchart illustrating a method of power supply line protection according to an embodiment of the present invention.

FIG. 4 is a flowchart illustrating a method of power supply line protection according to an embodiment of the present invention. The master device estimates the temperature of the first power supply line PL1 (step S401). When the estimated temperature of the first power supply line is higher than the first cutoff threshold (step S402, YES), the power supply via the first power supply line is cut off (step S403). The temperature of the second power supply line is estimated (step S404). When the estimated temperature of the second power supply line is higher than the second cutoff threshold (step S405, YES), power supply via the second power supply line is cut off (step S406).

<Processing Operation in Master Device 120>

Figure 5:
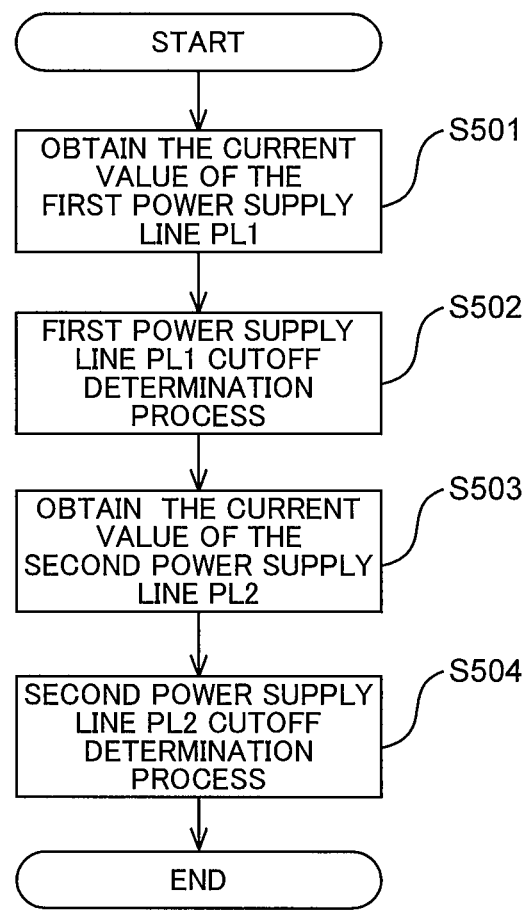
FIG. 5 is a flowchart illustrating an example of the processing operation of the master device 120 according to an embodiment of the present invention.

FIG. 5 is a flowchart illustrating an example of the processing operation of the master device 120 according to an embodiment of the present invention. This processing operation is repeatedly performed at predetermined time intervals. The current values of the plurality of first power supply lines PL1 are obtained (step S501). For each of the plurality of first power supply lines PL1, a cutoff determination process for the first power supply line PL1 described below is performed (step S502). The current values of the plurality of second power supply lines PL2 are obtained from the plurality of slave devices 130 (step S503). For each of the plurality of second power supply lines PL2, a cutoff determination process for the second power supply line PL2 described below is performed (step S504).

Figure 6:
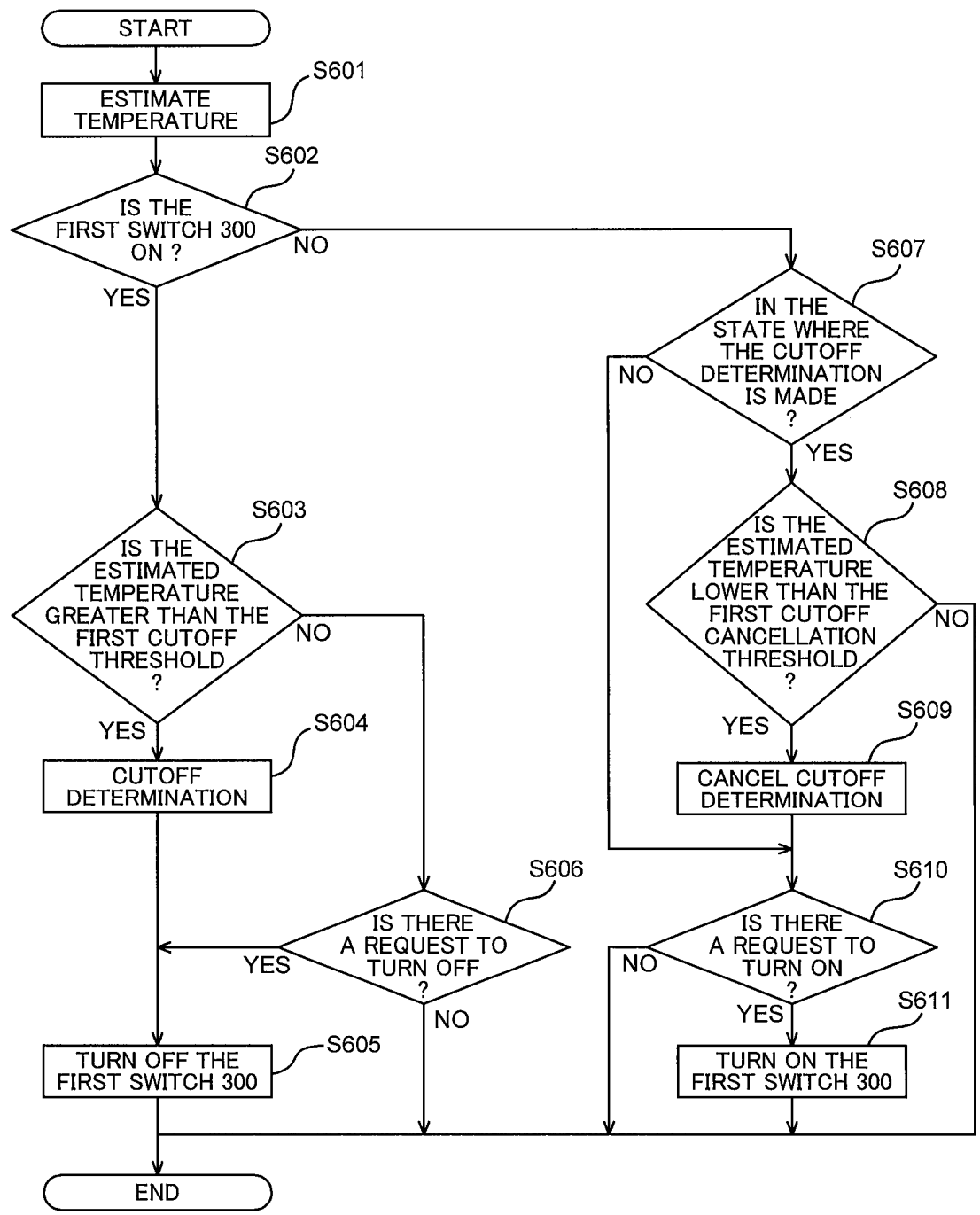
FIG. 6 is a flowchart illustrating an example of a process of determining cutoff of a first power supply line PL1 in step S502 in FIG. 5.

FIG. 6 is a flowchart illustrating an example of a process of determining cutoff of the first power supply line PL1 in step S502 in FIG. 5. This cutoff determination process for the first power supply line PL1 is performed for each of the plurality of first power supply lines PL1. The temperature of the first power supply line PL1 to be determined is estimated (step S601). It is determined whether or not the first switch 300 corresponding to this first power supply line PL1 is on (step S602).

When the first switch 300 corresponding to this first power supply line PL1 is on (step S602, YES), it is confirmed whether or not the estimated temperature of the first power supply line PL1 is higher than the first cutoff threshold (Step S603). If the estimated temperature of the first power supply line PL1 is higher than the first cutoff threshold (YES in step S603), it is determined that the power supply via the first power supply line PL1 is to be cut off, and the state that the first power supply line PL1 has been determined to be cut off is stored (step S604), the first switch 300 corresponding to the first power supply line PL1 is turned off (step S605), and the process ends. If the estimated temperature of the first power supply line PL1 is not higher than the first cutoff threshold (step S603, NO), if there is a request from another master device 120 or slave device 130 to turn off the first switch 300 corresponding to the first power supply line PL1 (step S606, YES), the first switch 300 corresponding to the first power supply line PL1 is turned off (step S605), and the process ends. If there is no request from another master device 120 or slave device 130 to turn off the first switch 300 corresponding to the first power supply line PL1 (step S606, NO), the process ends as it is.

When the first switch 300 corresponding to the first power supply line PL1 is off (step S602, NO), it is determined whether or not the first power supply line PL1 is in a state in which the cutoff determination is made (Step S607). Here, the state in which the cutoff determination is made is a state that the cancellation of the cutoff determination to cancel the cutoff of power supply via the first power line is not made, because by the previous processing operation, the estimated temperature of the first power supply line PL1 has not become lower than the first cutoff cancellation threshold, after the cutoff determination to determine that the power supply via the first power supply line is cut off was made since the estimated temperature of the first power supply line PL1 was higher than the first cutoff threshold by the previous processing operation.

If the first power supply line PL1 has been determined to be cut off (step S607, YES), it is determined whether or not the estimated temperature of the first power supply line PL1 is smaller than the first cutoff cancellation threshold (step S608). If the estimated temperature of the first power supply line PL1 is smaller than the first cutoff cancellation threshold (step S608, YES), the cutoff determination is canceled, and the fact that the first power supply line PL1 is not in the state of being determined to be cut off is stored (step S609). If there is a request from another master device 120 or slave device 130 to turn on the first switch 300 corresponding to the first power supply line PL1 (step S610, YES), the first switch 300 corresponding to the first power supply line PL1 is turned on (step S611), and the process ends. If there is no request from another master device 120 or slave device 130 to turn on the first switch 300 corresponding to the first power supply line PL1 (step S610, NO), the process ends as it is. If the estimated temperature of the first power supply line PL1 is not lower than the first cutoff cancellation threshold (step S608, NO), the process ends as it is.

If the first power supply line PL1 is not in the state where the cutoff has been determined (step S607, NO), if there is a request from another master device 120 or slave device 130 to turn on the first switch 300 corresponding to the first power supply line PL1 (step S610, YES), the first switch 300 corresponding to the first power supply line PL1 is turned on (step S611), and the process ends. If there is no request from another master device 120 or slave device 130 to turn on the first switch 300 corresponding to the first power supply line PL1 (step S610, NO), the process ends as it is.

Figure 7:
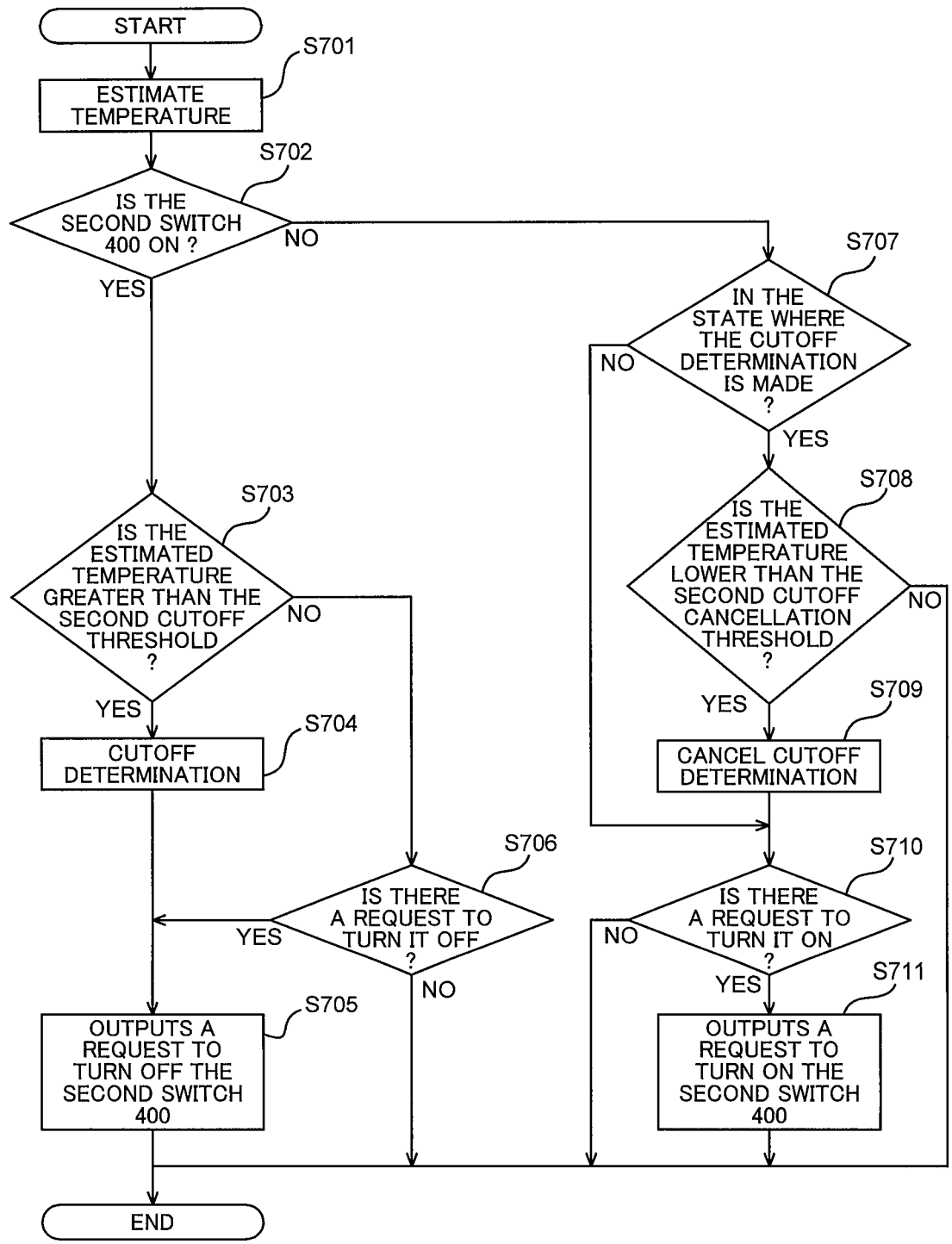
FIG. 7 is a flowchart illustrating an example of a process of determining cutoff of a second power supply line PL2 in step S504 in FIG. 5.

FIG. 7 is a flowchart illustrating an example of a process of determining cutoff of a second power supply line PL2 in step S504 in FIG. 5. The cutoff determination process for the second power supply line PL2 is performed for each of the plurality of second power supply lines PL2. No power is supplied to the second power supply line PL2 connected to the slave device 130 in which first switch 300 is turned off and power is not supplied, and there is no need to make a cutoff determination. Therefore, the cutoff determination process to the second power supply line PL2 is performed on the second power supply line PL2 connected to the slave device 130 to which power is supplied.

The temperature of the second power supply line PL2 to be determined is estimated (step S701). It is confirmed whether or not the second switch 400 corresponding to this second power supply line PL2 is on (step S702).

If the second switch 400 corresponding to the second power supply line PL2 is ON (step S702, YES), it is confirmed whether or not the estimated temperature of the second power supply line PL2 is greater than the second cutoff threshold (step S703). If the estimated temperature of the second power supply line PL2 is higher than the second cutoff threshold (step S703, YES), it is determined that the power supply via the second power supply line PL2 is to be cut off, the fact that this second power supply line PL1 is in the cutoff determination state is stored (step S704), a request to turn off the second switch 400 corresponding to the second power supply line PL2 is output to the slave device 130 that controls the second switch 400 (step S705), and the process ends. If the estimated temperature of the second power supply line PL2 is not higher than the second cutoff threshold (step S703, NO), if there is a request from another master device 120 or slave device 130 to turn off the second switch 400 corresponding to the second power supply line PL2 (step S706, YES), a request to turn off the second switch 400 corresponding to the second power supply line PL2 is output to the slave device 130 that controls the second switch (step S705), and the process ends. If there is no request from another master device 120 or slave device 130 to turn off the second switch 400 corresponding to the second power supply line PL2 (step S706, NO), the process ends as it is.

If the second switch 400 corresponding to the second power supply line PL2 is off (step S702, NO), it is confirmed whether or not the second power supply line PL2 is in a state where a cutoff determination is made (Step S707).

In a case where the cutoff determination has been made for the second power supply line PL2 (step S707, YES), it is confirmed whether or not the estimated temperature of the second power supply line PL2 is smaller than the second cutoff cancellation threshold (step S708). If the estimated temperature of the second power supply line PL2 is smaller than the second cutoff cancellation threshold (step S708, YES), the cutoff determination is cancelled, and the fact that the second power supply line PL2 is not in the cutoff determination state is stored (step S709). If there is a request from another master device 120 or slave device 130 to turn on the second switch 400 corresponding to the second power supply line PL2 (step S710, YES), a request to turn on the second switch 400 corresponding to the second power supply line PL2 is output to the slave device 130 that controls the second switch (step S711), and the process ends. If there is no request from another master device 120 or slave device 130 to turn on the second switch 400 corresponding to the second power supply line PL2 (step S710, NO), the process ends as it is. If the estimated temperature of the second power supply line PL2 is not smaller than the second cutoff cancellation threshold (step S708, NO), the process ends as it is.

In a case where the cutoff determination has not been made for the second power supply line PL2 (step S707, NO), if there is a request from another master device 120 or slave device 130 to turn on the second switch 400 corresponding to the second power supply line PL2 (step S710, YES), the second switch 400 corresponding to the second power supply line PL2 is turned on (step S711), and the process ends. If there is no request from another master device 120 or slave device 130 to turn on the second switch 400 corresponding to the second power supply line PL2 (step S710, NO), the process ends as it is.

The present invention has been described with reference to the preferred embodiments of the present invention. Although the present invention has been described with reference to specific embodiments, various modifications and changes can be made to these embodiments without departing from the spirit and scope of the present invention as set forth in the appended claims.

REFERENCE SIGNS LIST 100 power supply system
110 battery
120 master device
121 control unit
130 slave device
200 load
300 first switch
400 second switch
PL1 first power supply line
PL2 second power supply line

The invention claimed is:
1. A method of power supply line protection in a power supply system, the power supply system including: a battery; a master device supplied with power from the battery, and including a first control unit and a first switch; and a slave device supplied with power from the master device via a first power supply line, and including a second control unit and a second switch, the slave device supplying power to a load via a second power supply line, and the first control unit configured to control the first switch and the second switch, the method comprising:
estimating a temperature of the second power supply line by the master device; and
cutting off power supply via the second power supply line by the first control unit controlling the second switch such that the second switch cuts off the power supply via the second power supply line when the estimated temperature of the second power supply line is higher than a second cutoff threshold.
2. The method as claimed in claim 1, further comprising:
estimating a temperature of the first power supply line by the master device; and
cutting off power supply via the first power supply line when the estimated temperature of the first power supply line is higher than a first cutoff threshold.
3. A master device in a power supply system, the power supply system including: a battery; the master device supplied with power from the battery; and a slave device supplied with power from the master device via a first power supply line and having a second control unit and a second switch, and the slave device supplying power to a load via a second power supply line,
the master device comprising:
a first switch, and a first control unit that is configured to control the first switch and the second switch, and that estimates a temperature of the second power supply line, wherein the control unit estimates the temperature of the second power supply line based on a current value of the second power supply line acquired from the slave device, and controls the second switch in the slave device such that the second switch cuts off the power supply via the second power supply line when the estimated temperature of the second power supply line is greater than a second cutoff threshold.

4. A power supply system comprising:

a battery;

a master device supplied with power from the battery, the master device including a first control unit and a first switch; and a slave device supplied with power from the master device via a first power supply line, the slave device supplying power to a load via a second power supply line, the slave device including a second control unit and a second switch, wherein the first control unit of the master device is configured to control the first switch and the second switch, the second switch is configured to supply/cutoff of power via the second power supply line, the first control unit is configured to estimate a temperature of the second power supply line, and control the second switch such that the second switch cuts off the power supply via the second power supply line when the estimated temperature of the second power supply line is greater than a second cutoff threshold.

* * * * *